United States Patent
Lai et al.

(10) Patent No.: US 6,455,388 B1
(45) Date of Patent: Sep. 24, 2002

(54) METHOD OF MANUFACTURING METAL-OXIDE SEMICONDUCTOR TRANSISTOR

(75) Inventors: Han-Chao Lai, Taichung; Hung-Sui Lin, Hsin-Ying; Tao-Cheng Lu, Kaoshiung, all of (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/099,802

(22) Filed: Mar. 13, 2002

(30) Foreign Application Priority Data

May 29, 2001 (TW) .......................................... 90112866

(51) Int. Cl.$^7$ .......................................... H01L 21/336
(52) U.S. Cl. ........................ 438/303; 438/197; 438/289; 438/307; 438/595; 438/592
(58) Field of Search ................................. 438/197, 230, 438/289, 290, 299, 301, 302, 303, 305, 306, 307, 585, 592, 595, 651, 652, 656, 976

(56) References Cited

U.S. PATENT DOCUMENTS 6,046,089 A * 4/2000 Gardner et al. ............. 438/303
6,211,027 B1 * 4/2001 Lin et al. .................... 438/303
6,300,205 B1 * 10/2001 Fulford et al. .............. 438/303

* cited by examiner

Primary Examiner—Chandra Chaudhari
Assistant Examiner—Jack Chen
(74) Attorney, Agent, or Firm—J.C. Patents

(57) ABSTRACT

A method of fabricating a MOS transistor. First, a substrate having a gate electrode and spacers on the gate electrode sidewalls is provided. A source/drain region is formed in the substrate outside the outer edge of the spacer sidewalls. A self-aligned silicide layer is formed over the exposed surface of the gate electrode and the source/drain regions. A portion of the spacers is removed by etching to form a sharp-angled triangular spacer on the sidewalls of the gate electrode. A pocket implantation of the substrate is carried out to form a pocket region inside the substrate under the side edges of the gate electrode. By controlling the setting of the energy level and the implant angle in the pocket implantation, a precise distribution of the dopants at desired locations within the substrate is reproduced. Finally, the sharp-angled spacers are removed and then a light implantation is conducted to form source/drain extension regions in the substrate on each side of the gate electrode.

13 Claims, 4 Drawing Sheets

METHOD OF MANUFACTURING METAL-OXIDE SEMICONDUCTOR TRANSISTOR

This application claims the priority benefit of Taiwan application Ser. No. 90112866, filed on May 29, 2001.

BACKGROUND OF THE INVENTION

1. Field of Invention

The present invention relates to a method of manufacturing a semiconductor device. More particularly, the present invention relates to a method of manufacturing a metal-oxide-semiconductor (MOS) transistor.

2. Description of Related Art

The trend in the fabrication of very large scale integration (VLSI) circuits has always been to increase size of each silicon chip and decrease line width of devices and interconnects. Ultimately, more powerful functions may be provided by each silicon chip at a reduced cost. Moreover, a reduction in channel length of a transistor such as a metal-oxide-semiconductor (MOS) transistor also increases operating speed of the device.

However, as devices are miniaturized, a reduction in channel length often leads to an overlapping between the depletion layer around the source terminal and the drain terminal and the channel region. In general, the shorter the channel length, the greater will be the ratio of overlapping. With increasing channel length reduction, the effective length of a device channel is decreased, leading to the so-called short channel effect (SCE). To minimize the short channel effect, a shallow and lightly doped source/drain extension region is produced. Nevertheless, the incorporation of S/D extensions is incapable of preventing the high leakage current when the line width is smaller than 0.25 µm. A conventional method for reducing leakage current is to produce a doped pocket region at both ends of the channel close to the S/D extension region.

FIGS. 1A through 1C are schematic cross-sectional views showing the progression of steps for fabricating a conventional metal-oxide-semiconductor transistor.

As shown in FIG. 1A, a substrate 100 having a gate electrode 102 thereon is provided. A light implantation 104 is carried out to form a source/drain extension region 106 in the substrate 100.

As shown in FIG. 1B, a pocket implantation 108 is carried out to form a pocket region 110 in the substrate 100 under the side edges of the gate electrode 102.

As shown in FIG. 1C, spacers 112 are formed on the sidewalls of the gate electrode 102. Finally, a source/drain implantation 114 is carried out to form a source/drain region 116 in the substrate 100 on each side of the gate electrode 102.

The aforementioned method of forming a MOS transistor is capable of preventing leakage current as line width is shortened to 0.25 µm or less. However, when line width is shortened to 0.13 µm or less, the pocket regions are so close to each other that another phenomenon called reverse short channel effect (RSCE) occurs. In RSCE, threshold voltage (Vt) suddenly shoots up, leading to device failure when the pocket distance is reduced beyond a certain value. In addition, the pocket regions are usually formed deep inside the substrate. Hence, overall minimization of short channel effect is quite limited.

SUMMARY OF THE INVENTION

Accordingly, one object of the present invention is to provide a method of manufacturing a metal-oxide-semiconductor (MOS) transistor in a substrate. The method includes forming a pocket region at a shallow depth below the upper substrate surface under pre-defined pocket implantation conditions so that both short channel effect and reverse short channel effect are minimized. Hence, a deep sub-micron device can be fabricated.

To achieve these and other advantages and in accordance with the purpose of the invention, as embodied and broadly described herein, the invention provides a method of fabricating a MOS transistor. First, a substrate having a gate electrode and spacers on the gate electrode sidewalls is provided. A source/drain region is formed in the substrate outside the outer edge of the spacer sidewalls. A self-aligned silicide layer is formed over the exposed surface of the gate electrode and the source/drain regions. A portion of the spacers is removed by etching to form a sharp-angled spacer having a triangular cross-section on the sidewalls of the gate electrode. A pocket implantation of the substrate is carried out to form a pocket region inside the substrate under the side edges of the gate electrode. By controlling the energy level setting and the implant angle in the pocket implantation, a precise distribution of the dopants at desired locations within the substrate is reproduced. Hence, the pocket regions are formed close to the substrate surface. Finally, the sharp-angled spacers are removed and a light implantation is conducted to form source/drain extension regions in the substrate on each side of the gate electrode.

In this invention, sharp-angled spacers are used to reduce depth of ion implantation. Ultimately, the pocket regions are closer to the substrate surface and distance between the pocket region next to the source region and the pocket region next to the drain region is increased. Hence, both short-channel effect and reverse short channel effect are reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
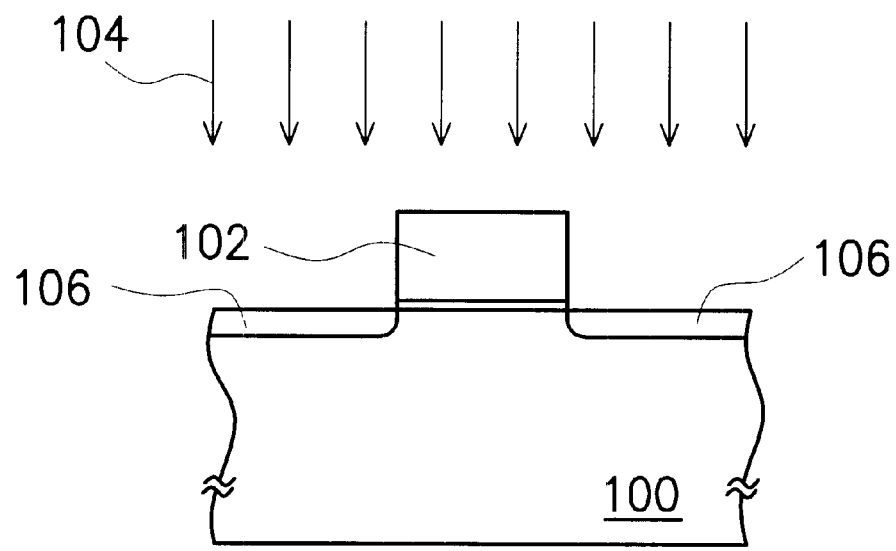
FIGS. 1A through 1C are schematic cross-sectional views showing the progression of steps for fabricating a conventional metal-oxide-semiconductor transistor.
Figure 1B:
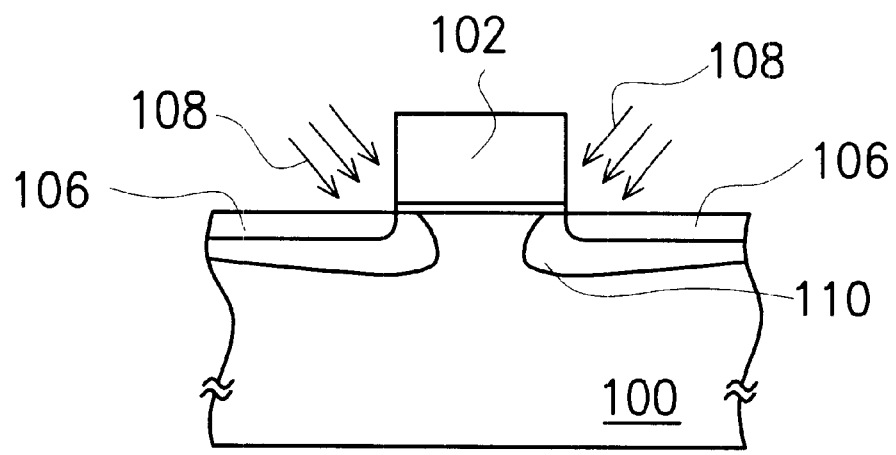
Figure 1C:
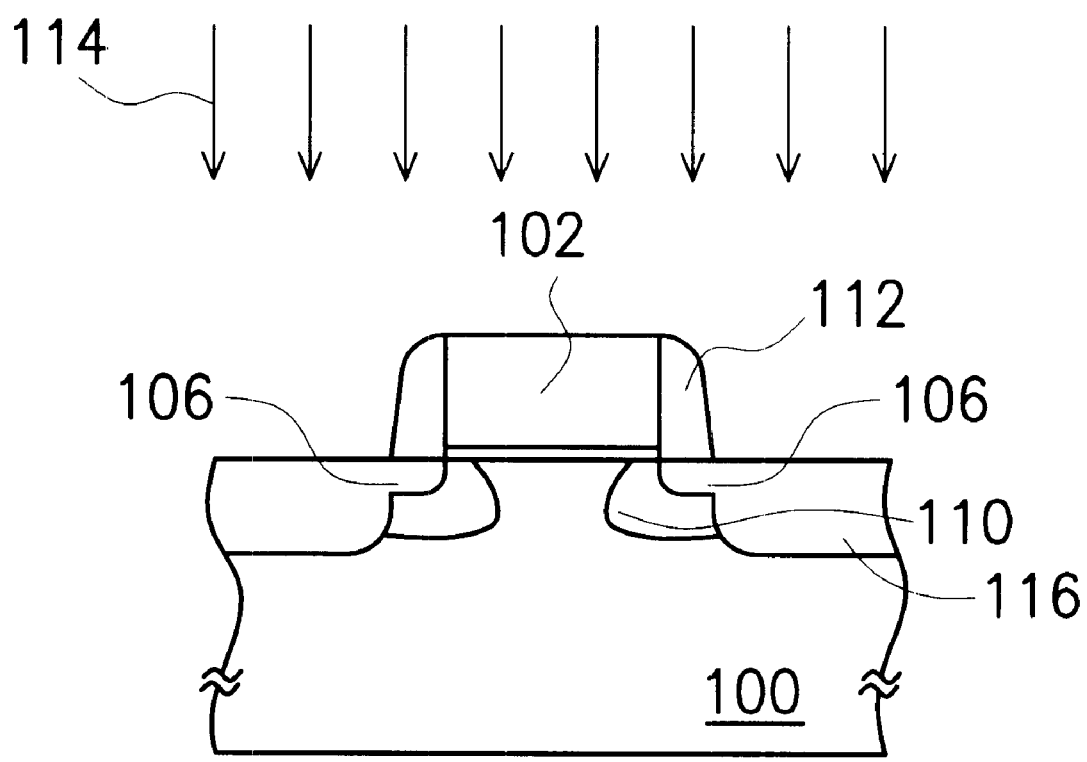

Reference will now be made in detail to the present preferred embodiments of the invention, examples of which are illustrated in the accompanying drawings. Wherever possible, the same reference numbers are used in the drawings and the description to refer to the same or like parts.

Figure 2A:
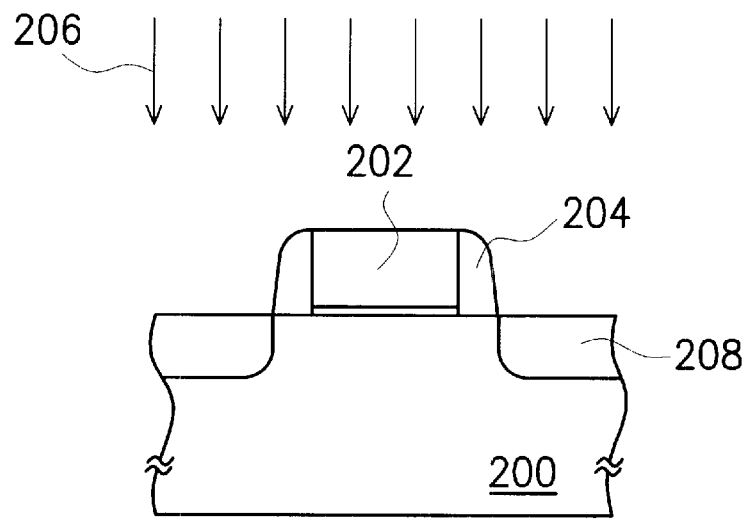
FIGS. 2A through 2E are schematic cross-sectional views showing the progression of steps for fabricating a metal-oxide-semiconductor transistor according to one preferred embodiment of this invention.

FIGS. 2A through 2E are schematic cross-sectional views showing the progression of steps for fabricating a metal-oxide-semiconductor transistor according to one preferred embodiment of this invention. As shown in FIG. 2A, a substrate 200 having a gate electrode 202 and spacers 204 on the gate electrode sidewalls is provided. The spacers 204 can be a silicon nitride layer formed, for example, by forming a silicon nitride layer over the substrate 200 and performing an anisotropic etching operation. A source/drain implantation 206 is conducted to form a source drain region 208 in the substrate 200 outside the outer edges of the spacer 204 sidewalls.

Figure 2B:
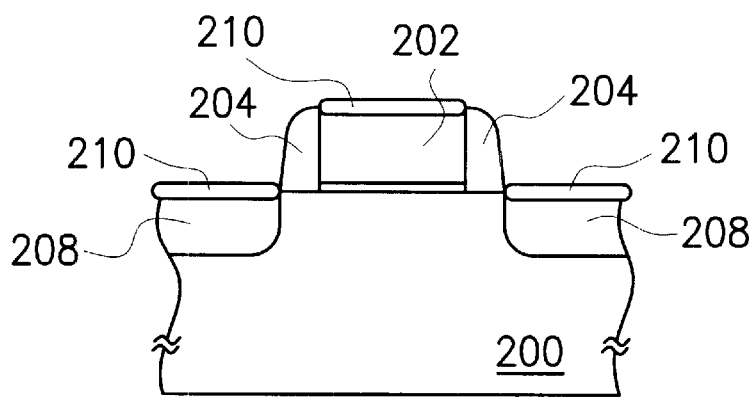

As shown in FIG. 2B, a self-aligned silicide layer 210 is formed on the exposed surface of the gate electrode 202 and the source/drain regions 208. The self-aligned suicide layer 210 is formed, for example, by depositing a metallic material such as titanium over the gate electrode 202, performing a thermal treatment so that the metal reacts with the silicon on the gate electrode 202 and the source/drain region 208, and finally removing the unreacted metal.

Figure 2C:
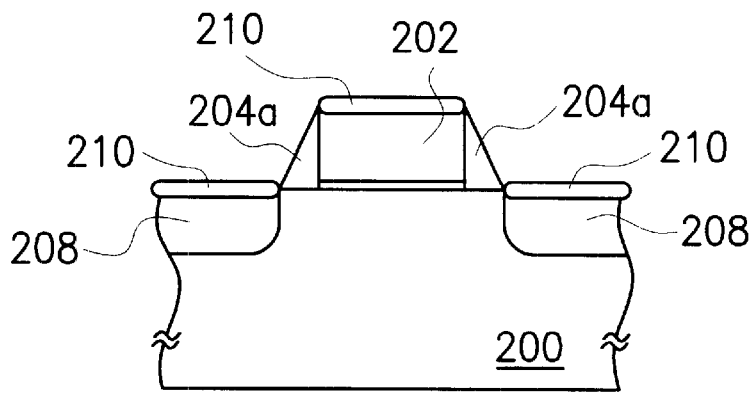

As shown in FIG. 2C, a portion of the spacers 204 is removed by performing a special anisotropic etching so that sharp-angled spacers 204a are formed having a triangular cross-section.

Figure 2D:
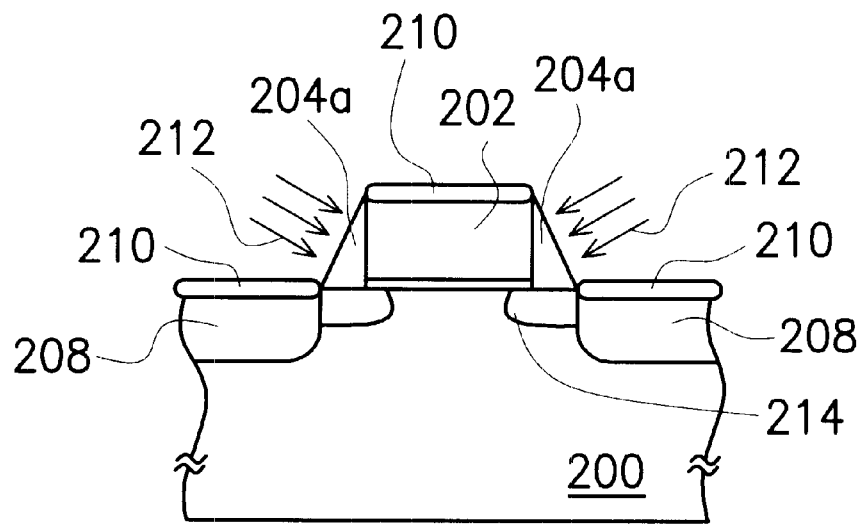

As shown in FIG. 2D, a pocket implantation 212 of the substrate 200 is conducted to form pocket regions 214 inside the substrate 200 on each side of the gate electrode 202. By a careful setting of the energy level and the implant angle in the pocket implantation 212, the distribution and location of the dopants inside the pocket regions 214 within the substrate 200 can be precisely controlled. Hence, the pocket regions 214 are formed close to the substrate 200 surface.

Figure 2E:
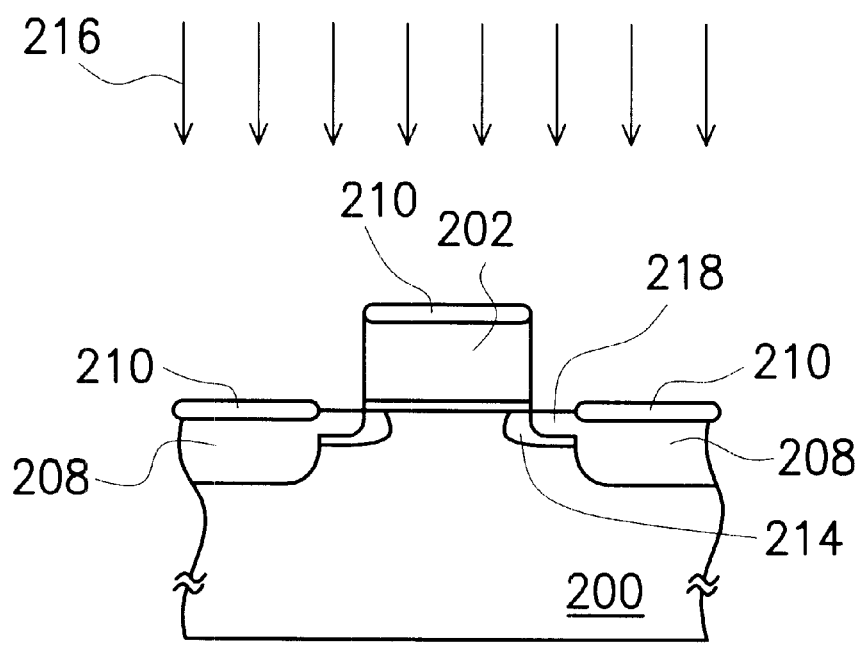

As shown in FIG. 2E, the sharp-angled spacers 204a are removed, for example, by wet etching. A light implantation 216 is conducted to form source/drain extension regions 218 in the substrate 200 on each side of the gate electrode 202.

In summary, major aspects of this invention include:

1. Sharp-angled spacers are used to reduce depth of ion implantation. Ultimately, the pocket regions are closer to the substrate surface and distance between the pocket region next to the source region and the pocket region next to the drain region is increased. Hence, both short-channel effect and reverse short channel effect are reduced.

2. Since the ions in the pocket implantation 212 penetrate a sharp-angled spacer 204a before entering the substrate 200, the distribution and location of ions are under more precise controlled when compared with a conventional pocket implantation process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a metal-oxide-semiconductor (MOS) transistor, comprising:

providing a substrate having a gate electrode and spacers on sidewalls of the gate electrode;

forming a source/drain region in the substrate outside side edges of the spacers;

forming a plurality of self-aligned silicide layers over an exposed surface of the gate electrode and the source/drain region;

etching to remove a portion of the spacers, thereby forming sharp-angled spacers on the sidewalls of the gate electrode;

conducting a pocket implantation of the substrate to form pocket regions inside the substrate, wherein the pocket regions are formed close to an upper substrate surface by controlling an energy level and an angle of pocket implantation;

removing the sharp-angled spacers; and forming a source/drain extension region in the substrate on each side of the gate electrode.

2. The method of claim 1, wherein removing the sharp-angled spacers includes wet etching.

3. The method of claim 1, wherein a material constituting the spacers includes silicon nitride.

4. The method of claim 1, wherein forming the self-aligned silicide layers further includes:

depositing a metallic material over the substrate and the gate electrode;

conducting a thermal treatment of the substrate so that metal in the metallic layer reacts with silicon in the gate electrode and the source/drain region to form a metal silicide; and removing unreacted metallic material.

5. The method of claim 4, wherein the metallic material includes titanium.

6. The method of claim 1, wherein the sharp-angled spacers include spacers having a triangular cross-section.

7. A method of manufacturing a metal-oxide-semiconductor (MOS) transistor, comprising:

providing a substrate having a gate electrode and spacers on sidewalls of the gate electrode;

forming a source/drain region in the substrate outside side edges of the spacers;

etching to remove a portion of the spacers, thereby forming sharp-angled spacers on the sidewalls of the gate electrode;

conducting a pocket implantation of the substrate to form pocket regions inside the substrate, wherein the pocket regions are formed close to an upper substrate surface by controlling an energy level and an angle of pocket implantation;

removing the sharp-angled spacers; and forming a source/drain extension region in the substrate on each side of the gate electrode.

8. The method of claim 7, wherein before etching the spacers to form sharp-angled spacers, further includes forming a plurality of self-aligned silicide layers over an exposed surface of the gate electrode and the source/drain region.

9. The method of claim 8, wherein forming the self-aligned silicide layers further includes:

depositing metallic material over the substrate and the gate electrode;

conducting a thermal treatment of the substrate so that metal in the metallic layer reacts with silicon in the gate electrode and the source/drain region to form metal silicide; and removing unreacted metallic material.

10. The method of claim 9, wherein the metallic material includes titanium.

11. The method of claim 7, wherein removing the sharp-angled spacers includes wet etching.

12. The method of claim 7, wherein the spacers are made of silicon nitride.

13. The method of claim 7, wherein the sharp-angled spacers include spacers having a triangular cross-section.

* * * * *